United States Patent
Darwish et al.

(10) Patent No.: US 11,740,312 B2
(45) Date of Patent: Aug. 29, 2023

(54) METHOD AND SYSTEM FOR MAGNETIC RESONANCE ELASTOGRAPHY

(71) Applicants: Siemens Healthcare GmbH, Erlangen (DE); King's College London, London (GB)

(72) Inventors: Omar Darwish, London (GB); Stephan Kannengießer, Wuppertal (DE); Ralph Sinkus, Parmain (FR); Radhouene Neji, London (GB)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 17/711,335

(22) Filed: Apr. 1, 2022

(65) Prior Publication Data

US 2022/0317219 A1  Oct. 6, 2022

(30) Foreign Application Priority Data

Apr. 1, 2021 (EP) .................................. 21166641

(51) Int. Cl.
  *G01R 33/563* (2006.01)
  *G01R 33/56* (2006.01)
  *G01R 33/561* (2006.01)

(52) U.S. Cl.
  CPC ... *G01R 33/56358* (2013.01); *G01R 33/5608* (2013.01); *G01R 33/5611* (2013.01)

(58) Field of Classification Search
  None
  See application file for complete search history.

(56) References Cited

U.S. PATENT DOCUMENTS

| 8,150,128 B2* | 4/2012 | Konofagou | A61B 8/485 600/437 |
| 2011/0006767 A1* | 1/2011 | Sack | A61B 5/0051 324/309 |
| 2011/0142316 A1* | 6/2011 | Wang | G06T 11/006 382/131 |
| 2012/0268128 A1 | 10/2012 | Lake et al. | |
| 2015/0301133 A1* | 10/2015 | Priatna | G01R 33/56358 324/309 |
| 2022/0179023 A1* | 6/2022 | Wu | G01R 33/4828 |
| 2022/0402752 A1* | 12/2022 | Goswami | H04R 3/002 |

OTHER PUBLICATIONS

Venkatesh, S.K., Yin, M. and Ehman, R.L. (2013), Magnetic resonance elastography of liver: Technique, analysis, and clinical applications. J. Magn. Reson. Imaging, 37: 544-555.

(Continued)

*Primary Examiner* — Rodney E Fuller
(74) *Attorney, Agent, or Firm* — Banner & Witcoff Ltd.

(57) ABSTRACT

A method and system for performing three-dimensional, 3D, magnetic resonance elastography, MRE, using a multi-slice gradient echo, GRE, imaging sequence. Four scans typically required to be performed during MRE, and during four breath-holds, are combined into a single measurement that can be performed during a single breath-hold.

17 Claims, 7 Drawing Sheets

(56) References Cited

OTHER PUBLICATIONS

Staeb D, Speier P, Reiter T , Klink T , Neubauer H ,Bley T A ,Wech T,Max Weng A, Kstler H. Restating MS-CAIPIRINHA as an In-plane Acceleration Problem: an Efficient Method for Integrating High Coverage Cardiac Perfusion MRI into Clinical Workflow. ISMRM 2015. Abstract #2686.

Dong, Huiming et al: "Magnetic resonance elastography for estimating in vivo stiffness of the abdominal aorta using cardiac-gated spin-echo echo-planar imaging: a feasibility study"; NMR in Biomedicine., [Online]; vol. 34, No. 1, Oct. 6, 2020 (Oct. 6, 2020), XP055838533.

Majeed, Waqas et al: "Simultaneous multislice rapid magnetic resonance elastography of the liver"; NMR in Biomedicine., [Online]; vol. 33, No. 4, Jan. 23, 2020 (Jan. 23, 2020), XP055838484.

Sinkus, R., Tanter, M., Catheline, S., Lorenzen, J., Kuhl, C., Sondermann, E. and Fink, M. (2005), Imaging anisotropic and viscous properties of breast tissue by magnetic resonance-elastography. Magn Reson. Med., 53: 372-387.

Guenthner, Christian et al: "Ristretto MRE: a generalized multi-shot GRE-MRE sequence" NMR in Biomedicine; vol. 32, No. 5, Jan. 29, 2019 (Jan. 29, 2019), p. e4049, XP055792386.

Breuer, Felix A. et al. "Controlled Aliasing in Parallel Imaging Results in Higher Acceleration (CAIPIRINHA) for Multi-Slice Imaging" Magnetic Resonance in Medicine, vol. 53, No. 3, pp. 684-691, 2005 // DOI: 10.1002/mrm.20401.

Günthner, Christian Josef: "Advanced Encoding Concepts for Magnetic Resonance Elastography"; 2019, pp. 1-153, XP055838539; DOI: 10.3929/ethz-b-000337639.

Najmudeen M.K. et al.: "3D MR Velocimetry Very Slow Flows"; Proceedings of the International Society for Magnetic Resonance in Medicine, 27th Annual Meeting & Exxhibition; No. 454, Apr. 26, 2019 (Apr. 26, 2019), XP040707841.

Sinkus, R, Lambert, S, Abd-Elmoniem, KZ, et al. Rheological determinants for simultaneous staging of hepatic fibrosis and inflammation in patients with chronic liver disease. NMR in Biomedicine. 2018; 31:e3956.

Garteiser, Philippe et al: "Rapid acquisition of multifrequency, multislice and multidirectional MR elastography data with a fractionally encoded gradient echo sequence"; NMR in Biomedicine; vol. 26, No. 10, May 28, 2013 (May 28, 2013) pp. 1326-1335, XP055116742.

Runge J. et al.:"A novel magnetic resonance elastography transducer concept based on a rotational eccentric mass: preliminary experiences with the gravitational transducer" Physics in Medicine & Biology, 64(4), 045007.

Guenthner C, Runge JH, Sinkus R, Kozerke S. Analysis and improvement of motion encoding in magnetic resonance elastography. NMR Biomed. May 2018;31(5):e3908. doi: 10.1002/nbm.3908. Epub Mar. 30, 2018. PMID: 29601114; PMCID: PMC6585970.

\* cited by examiner

METHOD AND SYSTEM FOR MAGNETIC RESONANCE ELASTOGRAPHY

TECHNICAL FIELD

The present disclosure generally relates to a method and system for performing three-dimensional, 3D, magnetic resonance elastography, MRE. In particular, the present disclosure relates to a method and system for imaging an area of a patient using a multi-slice gradient echo, GRE, imaging sequence.

BACKGROUND

Elastography is a medical imaging technique that is used to provide diagnostic information about the presence of a particular disease, using the elastic properties and stiffness of soft tissue. For example, diseased livers may be stiffer than healthy livers, and cancerous breast tumours may be stiffer than the surrounding normal breast tissue.

Magnetic resonance elastography, MRE, is a type of elastography that uses magnetic resonance imaging, MRI, to quantify and map the elasticity of stiffness of soft tissue. MRE is a useful, non-invasive tool for diagnosing certain diseases. MRE determines the stiffness of soft tissues by measuring the biomechanical response of the tissues to shear waves (i.e. vibrations). The MRE process involves using a mechanical device (such as a transducer) to generate vibrations and, therefore, waves which travel into a patient's tissues. An MRI acquisition sequence then measures the propagation and velocity of the waves. The measurements are used to infer and map tissue stiffness and viscosity. The stiffness map, also known as an elastogram, that is output by the MRE process is used to diagnose certain diseases or the progression of those diseases.

Biomechanical parameters, such as elasticity, viscosity, and frequency dispersion, determined or inferred using MRE are of particular interest in quantifying liver fibrosis or liver damage. Generally speaking, liver fibrosis may be diagnosed and treater earlier using MRE because liver fibrosis is triggered by prolonged inflammation, and MRE can be used to identify inflamed livers without needing to perform biopsies. Similarly, MRE may be used to non-invasively diagnose breast and brain tumours.

The MRE stiffness map may be obtained by applying two-dimensional (2D) sequences that have motion encoding gradients in a single direction. Two-dimensional sequences can be useful because they can be applied during a single breath-hold. That is, a patient being imaged only needs to hold their breath once while the 2D sequences are applied. However, although the imaging process is quick, 2D wave fields result in poor tissue stiffness estimation because wave propagation is three-dimensional, and a correct estimation of biomechanical parameters requires all directional information in complex objects such as a patient's liver.

Alternatively, the MRE stiffness map may be obtained by applying three-dimensional (3D) sequences that have motion encoding gradients in all three directions. The term "3D sequence" is used herein to refer to three-dimensional motion encoding (not to 3D slab excitation). Clinically, 3D sequences for MRE lead to more accurate estimates of biomechanical parameters, and they can be used to better distinguish between low grade liver fibrosis and liver inflammation by providing both elasticity and viscosity maps. However, currently, 3D sequences for MRE use gradient echo (GRE) sequences which require multiple breath-holds. Typically, 3D GRE-MRE sequences require four breath-holds: three acquisitions are executed with motion encoding in three orthogonal directions (Phase, Readout, Slice), and a reference acquisition without motion encoding that enables the background phase error to be acquired. An example of this process is the "eXpresso" sequence, which is described by Garteiser P, Sahebjavaher R S, Ter Beek L C, Salcudean S, Vilgrain V, Van Beers B E, and Sinkus R. in "*Rapid acquisition of multifrequency, multislice and multidirectional MR elastography data with a fractionally encoded gradient echo sequence*", NMR Biomed. 2013 October, 26(10):1326-35.

The eXpresso sequence requires a patient to hold their breath four times while the four scans are performed, and information needs to be collated from each breath-hold. The four acquisitions are synchronised to the relatively low mechanical vibration frequency (typically 60 Hz) and require the acquisition of multiple temporal offsets between vibration and MRE acquisition in order to capture the wave displacement at different wave phases. This means that duration for a single breath-hold for a GRE-based MRE scan is around 15-20 seconds. Hence, it is not possible to perform all four required acquisitions/scans during a single breath-hold. This requirement of four breath-holds hampers clinical acceptance and reduces the quality and, hence, the precision of the viscoelastic parameters, due to imperfect geometrical alignment of the images acquired in different breath-holds.

Therefore, there is a desire to provide an improved method and system for performing 3D MRE which overcomes the problems described above.

SUMMARY

To address these problems, the present techniques provide a method for performing three-dimensional magnetic resonance elastography, MRE, using a magnetic resonance imaging, MRI, apparatus, the method comprising: inducing a plurality of three-dimensional shear or compressional waves in an anatomical region of interest in a patient; performing image acquisition during a single patient breath-hold by applying a multi-slice gradient echo, GRE, imaging sequence, in combination with an in-plane acceleration technique, to the anatomical region of interest; and obtaining an image of the anatomical region comprising a first image slice and a second image slice, wherein the first slice and the second slice are partly overlaid in the image. The number of slices in the multi-slice GRE imaging sequence may be at least seven.

Advantageously, the present techniques provide an imaging sequence, also referred to as an "Intenso" sequence herein, which enables the four scans to be combined into a single measurement that can be performed during a single breath-hold. The sequence, and therefore the required breath-hold, is around 17 seconds long.

Existing MRE techniques use a slice selection process to select specific slices at particular frequencies. In contrast, the present techniques use multiple bands to excite two slices at the same time. The two slice images will be overlaid in a single image, and it is difficult to separate out the two slice images. Advantageously, the present techniques shift one slice relative to the other so that the two slices are partly overlaid in the image, as it is easier to separate out the two slices when they are only partly overlaid. The mechanism used to shift one slice relative to the other is described in more detail below.

The Intenso sequence combines an in-plane parallel imaging technique, with a multi-shot interleaved multi-slice gradient echo, GRE, sequence. A multi-slice GRE sequence, also known as a "Ristretto" sequence, has been described by Guenthner C, Sethi S, Troelstra M, Dokumaci A S, Sinkus R, and Kozerke S. in "*Ristretto MRE: A generalized multi-shot GRE-MRE sequence*", NMR Biomed. 2019 May, 32(5): e4049.

Thus, applying a multi-slice GRE imaging sequence comprises applying a radio frequency, RF, pulse to the anatomical region of interest, the RF pulse simultaneously exciting two slice locations in the anatomical region of interest.

The in-plane acceleration technique used in combination with applying the multi-slice GRE imaging sequence, may be a parallel imaging technique. The in-plane acceleration technique may be used to perform in-plane slice accelerations (or undersampling). In-plane slice accelerations may lead to reductions in signal to noise. The parallel imaging technique may be a GeneRalized Autocalibrating Partial Parallel Acquisition, GRAPPA, technique (as described by Staeb D, Speier P, Reiter T, Klink T, Neubauer H, Bley T A, Wech T, Max Weng A, and Kstler H in "Restating MS-CAIPIRINHA as an In-plane Acceleration Problem: An Efficient Method for Integrating High Coverage Cardiac Perfusion MRI into Clinical Workflow", ISMRM 2015, Abstract #2686).

In order to perform MRE using three-dimensional wave fields, the MRI acquisition needs to be synchronised with the temporal component of the wave propagation. The Intenso sequence incorporates time delays within imaging shots in order to synchronise slice and vibrational wave phase acquisition with the mechanical vibration. This allows the interleaved acquisition of multiple slices, wave phases and motion encodings in a single concatenated measurement. Importantly, the time delays are constructed such that the eddy-current steady state is not perturbed within each motion encoding part.

Thus, applying a multi-slice GRE imaging sequence comprises synchronising the application of the multi-slice GRE imaging sequence to mechanical vibrations in the anatomical region of interest caused by the three-dimensional shear or compressional waves.

Synchronising the application of the multi-slice GRE imaging sequence to mechanical vibrations may comprise applying a constant delay after each imaging shot within the multi-slice GRE imaging sequence. Preferably, applying a multi-slice GRE imaging sequence may further comprise performing an interleaved acquisition of multiple slices and wave offsets. This enables accelerated multi-slice MRE acquisitions, as described in the Ristretto paper.

Performing image acquisition may comprise using simultaneous multi-slice, SMS, imaging. The SMS imaging may use dual-band RF pulses with different phase cycles (slice 1: $0, 0, 0, 0 \ldots$, slice 2: $0, \pi, 0, \pi \ldots$) in the phase-encoding direction, that excite two slices simultaneously resulting in an image where one slice is shifted in the phase oversampling region of the other slice.

Applying a multi-slice GRE imaging sequence may comprise applying a motion encoding gradient or scheme along three axes simultaneously. For example, the motion encoding gradient may be applied along each of a slice, phase and read direction. Thus, the three axes may correspond to slice, phase and read.

Applying the motion encoding gradient may comprise applying a motion encoding gradient or scheme. For example, the motion encoding scheme may be a Hadamard motion encoding scheme, but it will be understood that this is just one example of a suitable scheme. The Hadamard motion encoding gradient advantageously increases motion sensitivity and thereby counteracts the noise amplification ("g-factor") signal-to-noise penalty that occurs when performing multi-slice imaging (such as SMS imaging). The g-factor penalty is a problem when using multi-slice imaging because the number of slices is typically low (e.g. ~8) and the slices are thin (e.g. ~4 mm thick) without gap. Hadamard encoding results in an implicit phase averaging effect, which results in an increase in signal-to-noise.

The method may further comprise processing the obtained image using an inversion algorithm to generate one or more quantitative images depicting a biomechanical parameter of the anatomical region of interest. The one or more quantitative images may depict any one or more of the following biomechanical parameters: stiffness, elasticity, viscosity, attenuation, wave speed, phase angle, and frequency dispersion.

In order to generate the quantitative images, decoding may be applied to each signal received by each coil of the MRI apparatus during image acquisition, prior to signal combination. Decoding is needed to remove any phase error in the signals. The decoding operation is the opposite or inverse of the encoding scheme. Thus, in the case where a Hadamard motion encoding scheme was applied, Hadamard decoding may be applied. The Hadamard decoding involves applying to the signals, the inverse of the matrix used to perform the Hadamard encoding. The decoding cannot easily be performed after coil signal combination, because it is difficult to remove the phase error after the signals have already been combined.

The Intenso sequence of the present techniques may be used to image any anatomical region of interest, such as, but not limited to, the liver, brain, or breast. Thus, the present techniques may be used to perform liver fibrosis and liver inflammation quantification, and to identify or diagnose brain and breast tumours. It will be understood that these are just some non-limiting example applications of the present techniques.

The present techniques also provide a (non-transitory) computer readable medium carrying processor control code which when implemented in a system (e.g. an image capture system or image processor) causes the system to carry out the methods described herein.

The present techniques also provide an image capture system for performing three-dimensional magnetic resonance elastography, MRE. The system may comprise a transducer for inducing a plurality of three-dimensional shear or compressional waves in an anatomical region of interest in a patient. The system may comprise an image capture device which is configured to capture images using the methods described herein. The system may comprise a user interface which is configured to display the images captured by the image capture device.

BRIEF DESCRIPTION OF THE DRAWINGS

The above-mentioned attributes and other features and advantages of this disclosure and the manner of attaining them will become more apparent and the disclosure itself will be better understood by reference to the following description of aspects of the disclosure taken in conjunction with the accompanying drawings, wherein.

DETAILED DESCRIPTION

Figure 1:
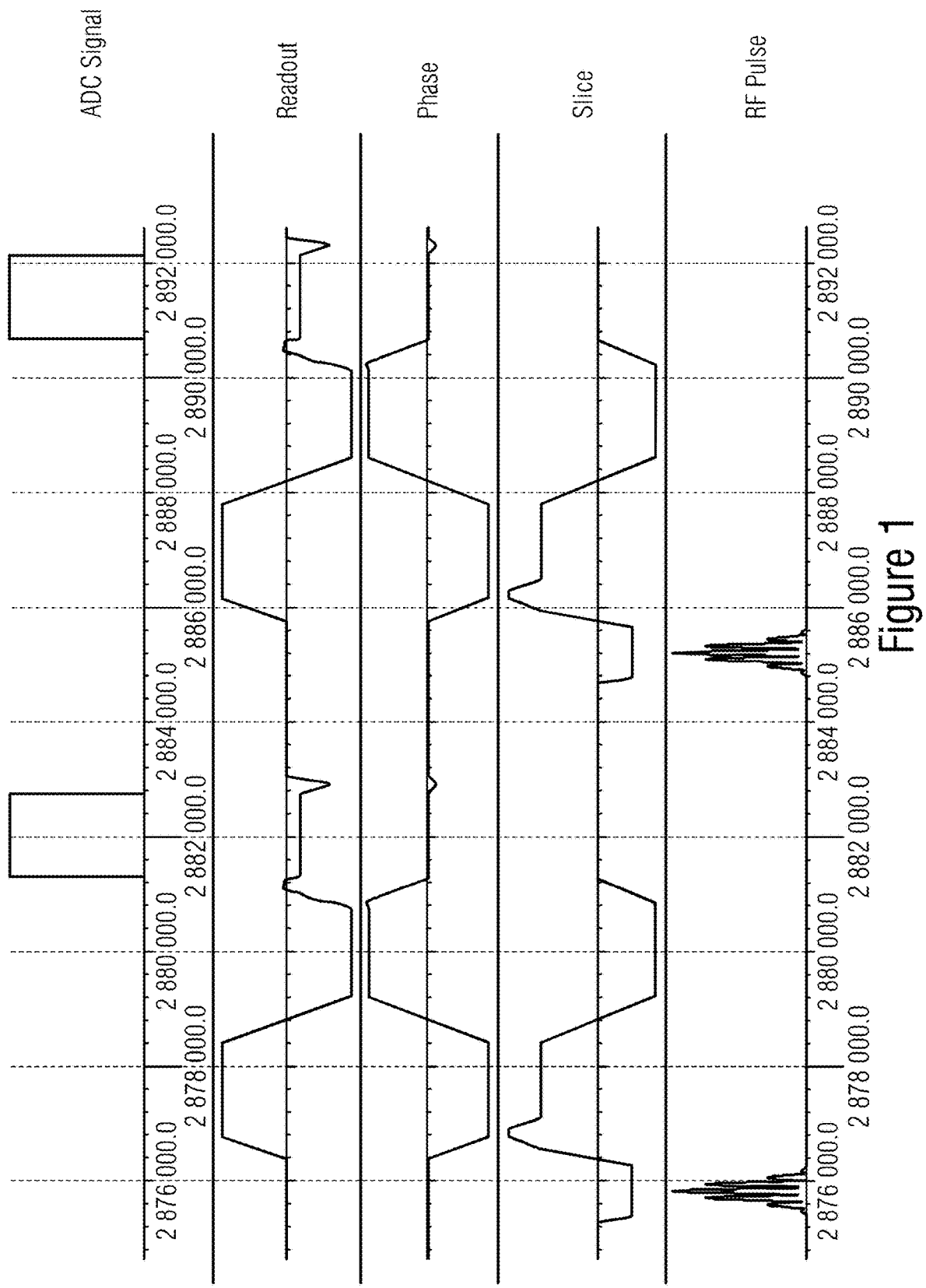
FIG. 1 shows a diagram of an example Intenso imaging sequence in accordance with aspects of the disclosure.

FIG. 1 shows a diagram of an example of a Intenso imaging sequence in accordance with aspects of the disclosure. It can be seen that the Intenso sequence comprises applying a complex radio frequency, RF, pulse which excites two slices simultaneously. Furthermore, it can be seen that by applying Hadamard motion encoding gradients to each of the slice, phase and read directions, the signal-to-noise ratio is improved. Hadamard motion encoding gradient advantageously increases motion sensitivity and thereby counteracts the noise amplification signal-to-noise penalty that occurs when performing multi-slice imaging. Hadamard encoding results in an implicit phase averaging effect, which results in an increase in signal-to-noise.

The Intenso sequence of the present techniques was tested using a 3T system (Biograph mMR, Siemens Healthcare, Erlangen, Germany). The tests were performed to determine whether data could be collected, and biomechanical parameters determined, within a single breath-hold. Thus, the Intenso sequence was compared to the existing eXpresso sequence.

Liver experiments were performed with 60 Hz actuation frequency in three healthy volunteers with four wave-phase offsets and four Hadamard motion encoding combinations (20 mT/m). Imaging parameters were 8 slices, 4 mm isotropic resolution, a 96×66 acquisition matrix acquired with a total acceleration factor of 5 (including in-plane and SMS acceleration) resulting in an FOV of 386×264×32 mm$^3$, TR=9.38 ms, TE=7.38 ms. This resulted in a breath-hold (BH) duration of 17 seconds. Intenso was compared with an eXpresso sequence with matching imaging parameters but acquired in four breath-holds of 21 seconds each.

Figure 2:
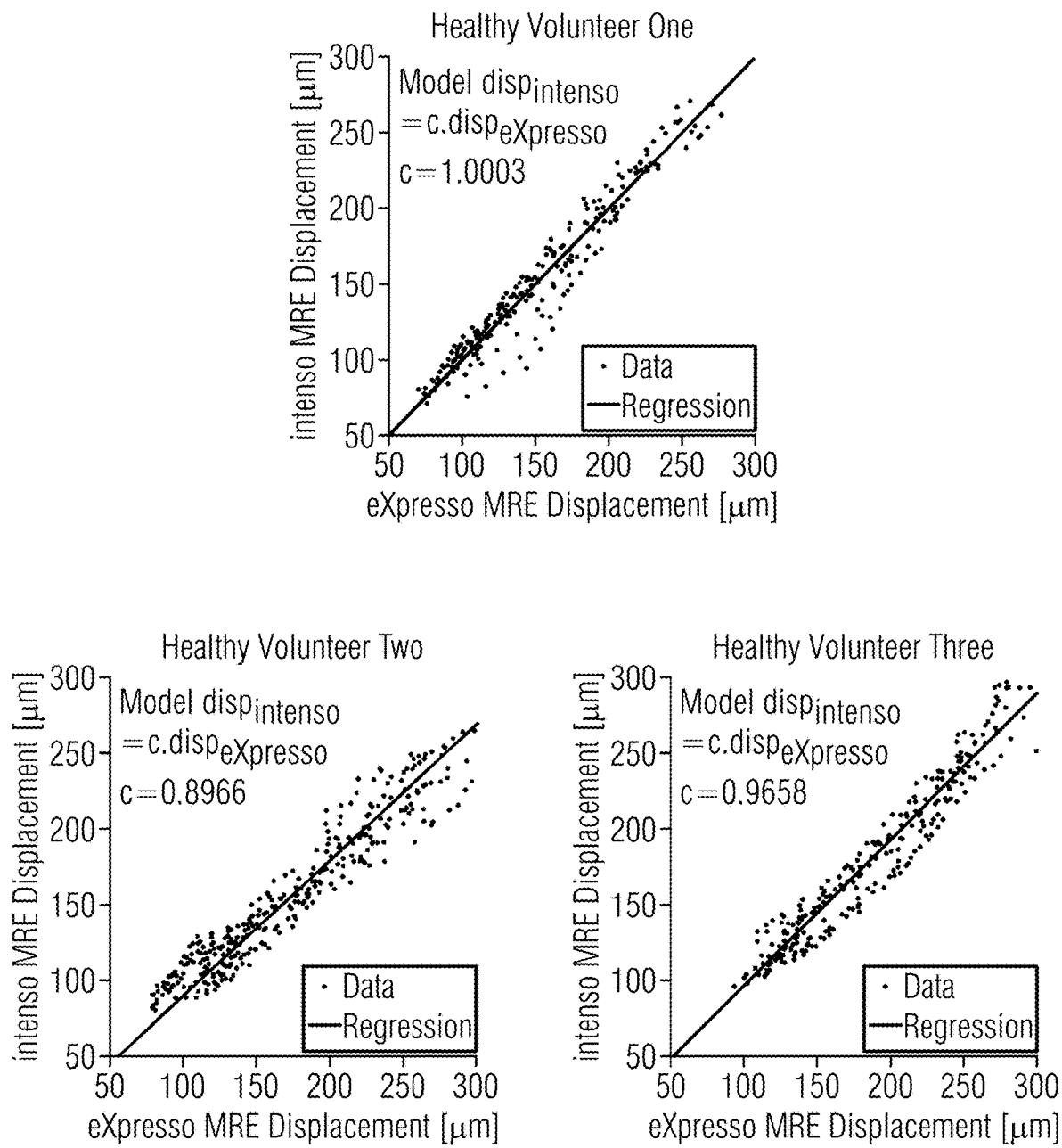
FIG. 2 shows plots of total amplitude of a complex displacement vector measured by applying the eXpresso and Intenso sequences to three healthy volunteers.

FIG. 2 shows plots of total amplitude of a complex displacement vector (field) measured by applying the eXpresso and Intenso sequences to three healthy volunteers. A simple linear regression analysis was carried out to quantify the regression slopes. The regression model is shown on the three graphs. The plots show a good agreement between the two sequences, with regression slopes ranging between 0.8966 and 1.0003. Thus, the experiments show that the present techniques (i.e. Intenso sequences) work as well as the eXpresso sequences, while advantageously only requiring one breath-hold.

Figure 3:
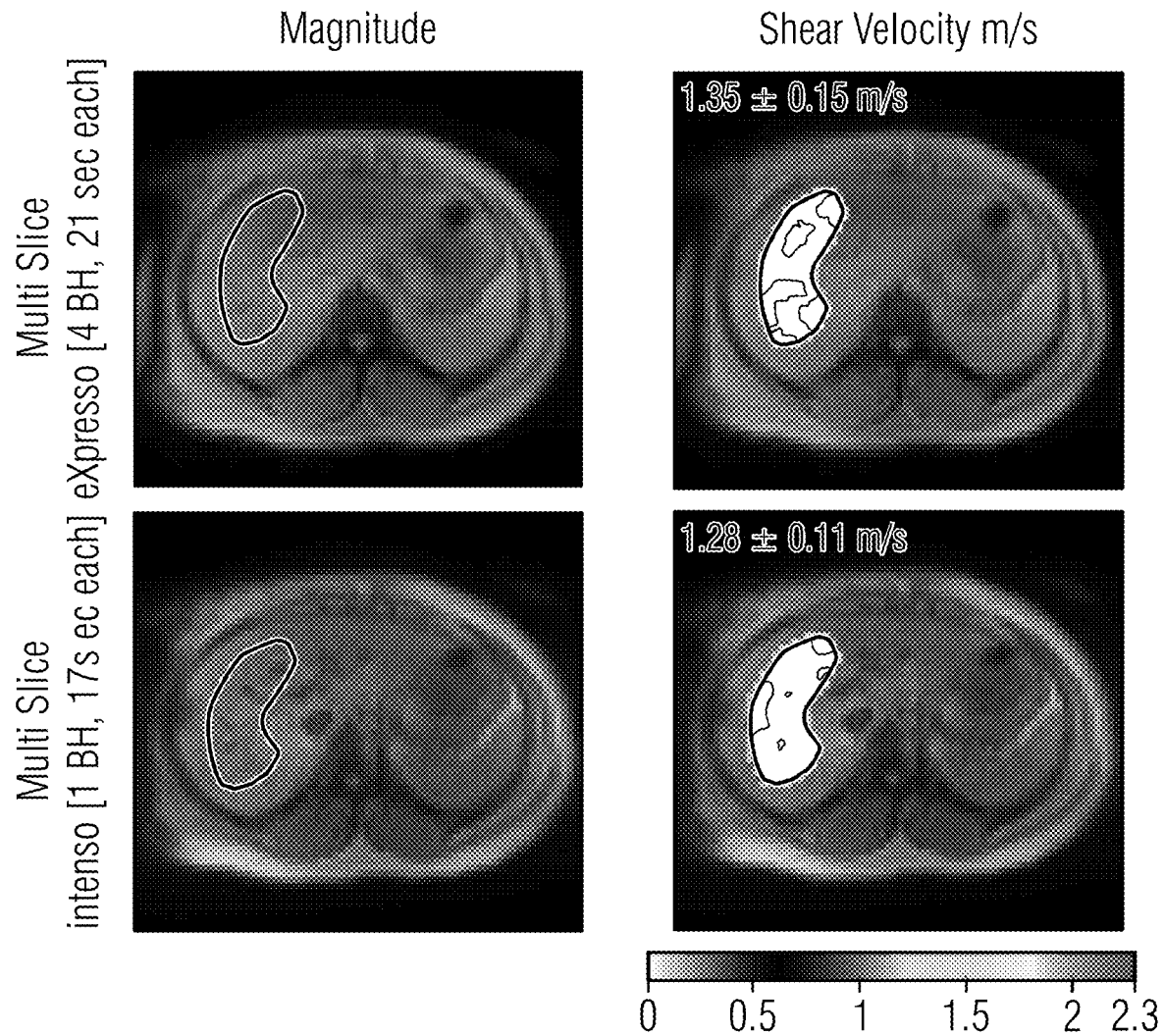
FIG. 3 shows the shear velocity in the liver determined using eXpresso and Intenso.

FIG. 3 shows the shear velocity in the liver of volunteer 1, determined by applying the eXpresso and Intenso sequences. The shear velocity (m/s) is average over the four inner-most slices. The liver is highlighted on the images, and the average shear speed is reported. The shear velocity obtained via eXpresso and Intenso for volunteer 1 are closely matched. The shear velocity was also obtained for the liver of volunteers 2 and 3: the image data is not shown, but the shear velocity for volunteers 2 and 3 showed a similar agreement, as shown in Table 1 below.

TABLE 1

| Volunteer | Shear velocity (m/s): eXpresso | Shear velocity (m/s): Intenso |
|---|---|---|
| 1 | 1.35 ± 0.15 | 1.28 ± 0.11 |
| 2 | 1.31 ± 0.13 | 1.25 ± 0.13 |
| 3 | 1.37 ± 0.18 | 1.41 ± 0.21 |

The magnitude images obtained via eXpresso and Intenso are also shown for volunteer 1 in FIG. 3. The high-quality magnitude images are generated by averaging the different encoding directions.

Figure 4:
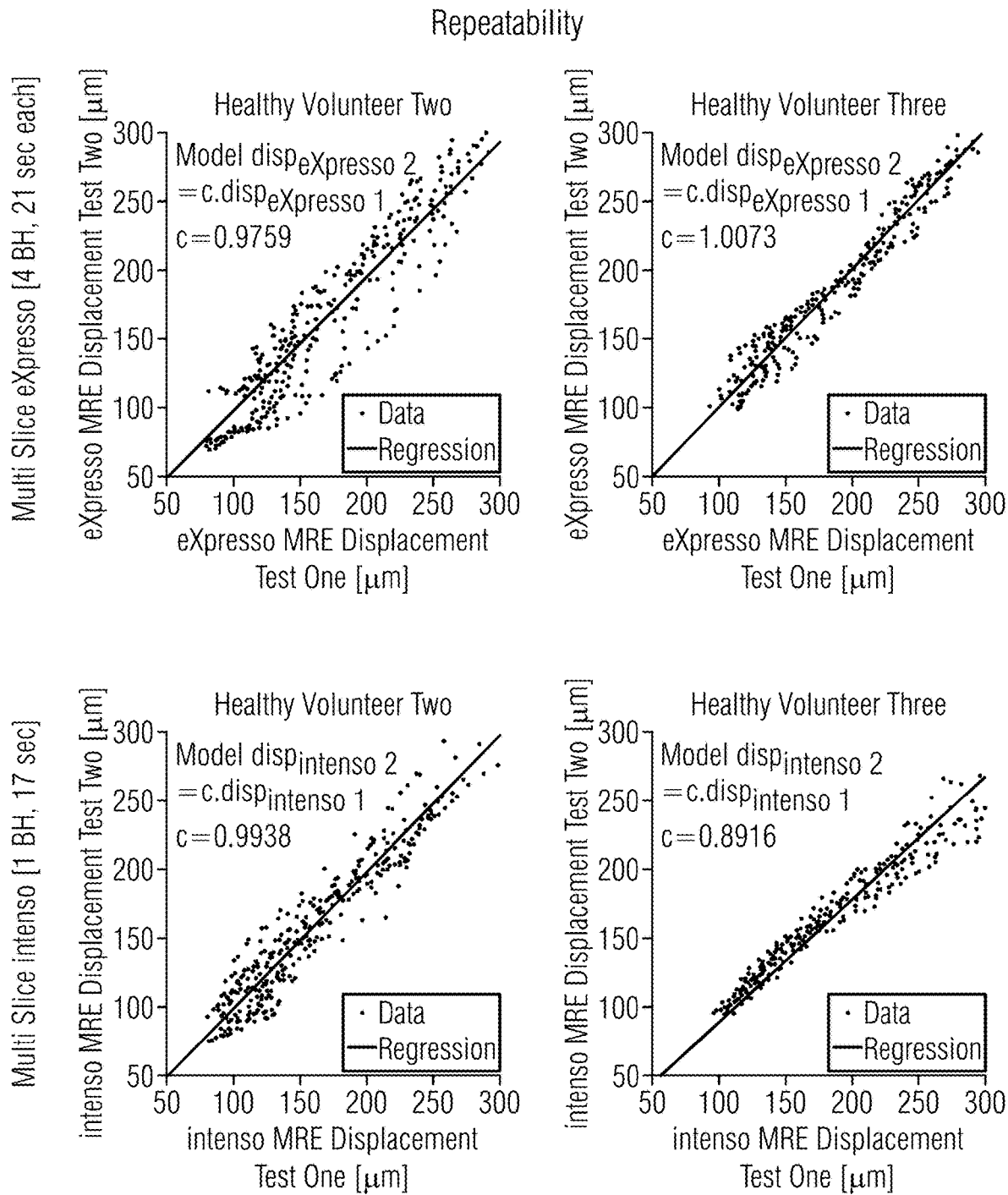
FIG. 4 shows repeatability test results using eXpresso and Intenso.

FIG. 4 shows the results of repeatability tests carried out for volunteers 2 and 3. Each volunteer was scanned twice ("test one" and "test two") with the eXpresso and Intenso sequences. The graphs show the total amplitude of the complex displacement field measured in the two tests. Simple linear regression analysis was carried out on the total amplitude of the complex field vector (μm), showing high agreement between test one and test two. The regression model is displayed next to the data points. The regression slopes range between 0.8916 and 1.0073, thereby showing that the tests (and results of the tests) were repeatable.

Figure 5:
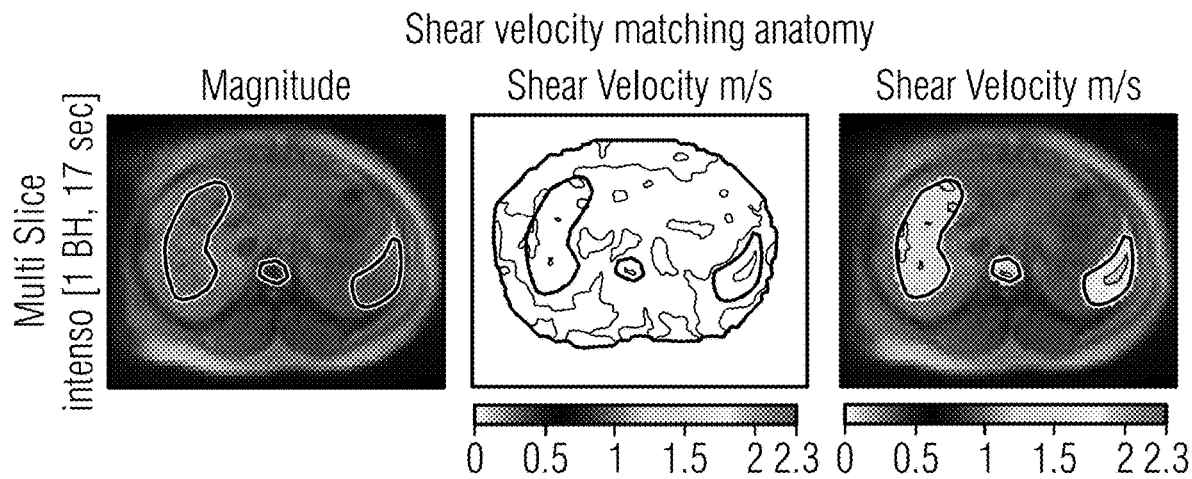
FIG. 5 shows a shear velocity map of the abdomen determined using Intenso.

FIG. 5 shows a shear velocity map of the abdomen determined using the Intenso sequence. The shear velocity values are acquired for volunteer 1 using Intenso, are averaged over the four inner-most slices, and matched with the abdominal anatomy on the map. The liver, spleen and spine are highlighted. As expected, the shear velocity is higher in the spleen (1.67±0.19 m/s) compared to the liver (1.28±0.11 m/s).

Figure 6:
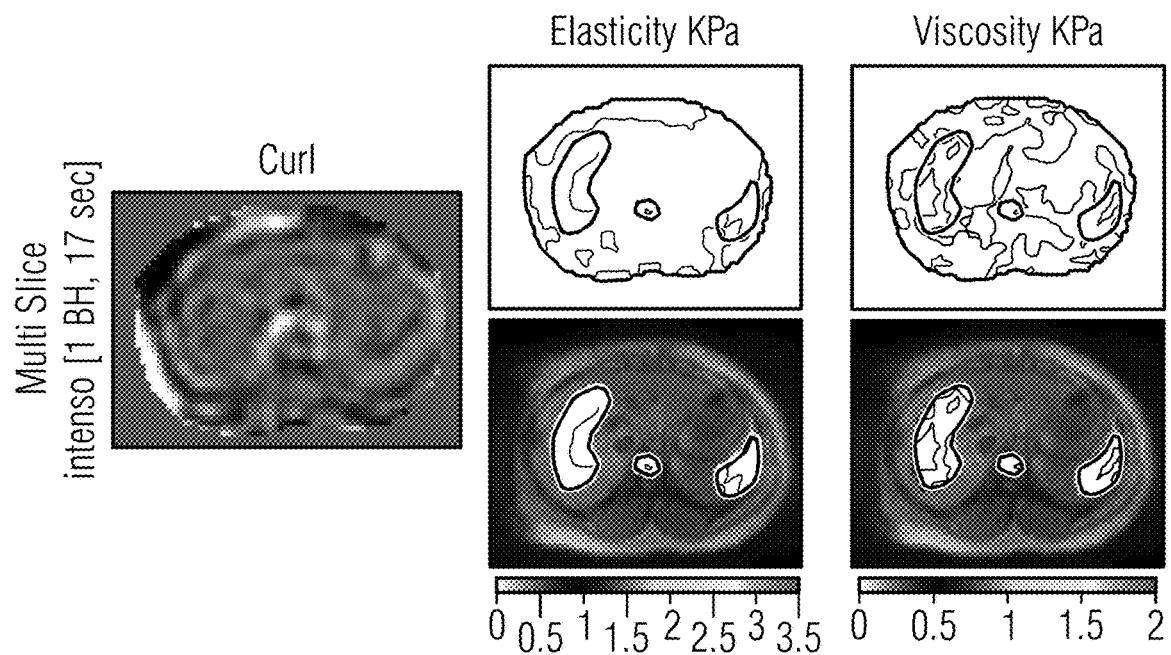
FIG. 6 shows elasticity and viscosity maps of the abdomen determined using Intenso.

FIG. 6 shows elasticity and viscosity maps (KPa) of the abdomen of volunteer 1, determined using the Intenso sequence. FIG. 6 also shows one component of the curl of the displacement field. The viscoelastic values are averaged over the four inner-most slices. It can be seen that the viscoelastic maps match with the abdominal anatomy—the liver, spleen and spine are highlighted. The spleen has higher elasticity and viscosity values than the liver, as shown in Table 2 below.

TABLE 2

| Volunteer | Elasticity: spleen (KPa) | Elasticity: liver (KPa) | Viscosity: spleen (KPa) | Viscosity: liver (KPa) |
|---|---|---|---|---|
| 1 | 2.18 ± 0.48 | 1.44 ± 0.27 | 0.98 ± 0.43 | 0.53 ± 0.21 |
| 2 | 1.97 ± 0.50 | 1.42 ± 0.29 | 0.81 ± 0.53 | 0.44 ± 0.19 |
| 3 | 2.46 ± 1.03 | 1.74 ± 0.52 | 1.10 ± 0.79 | 0.68 ± 0.37 |

Figure 7:
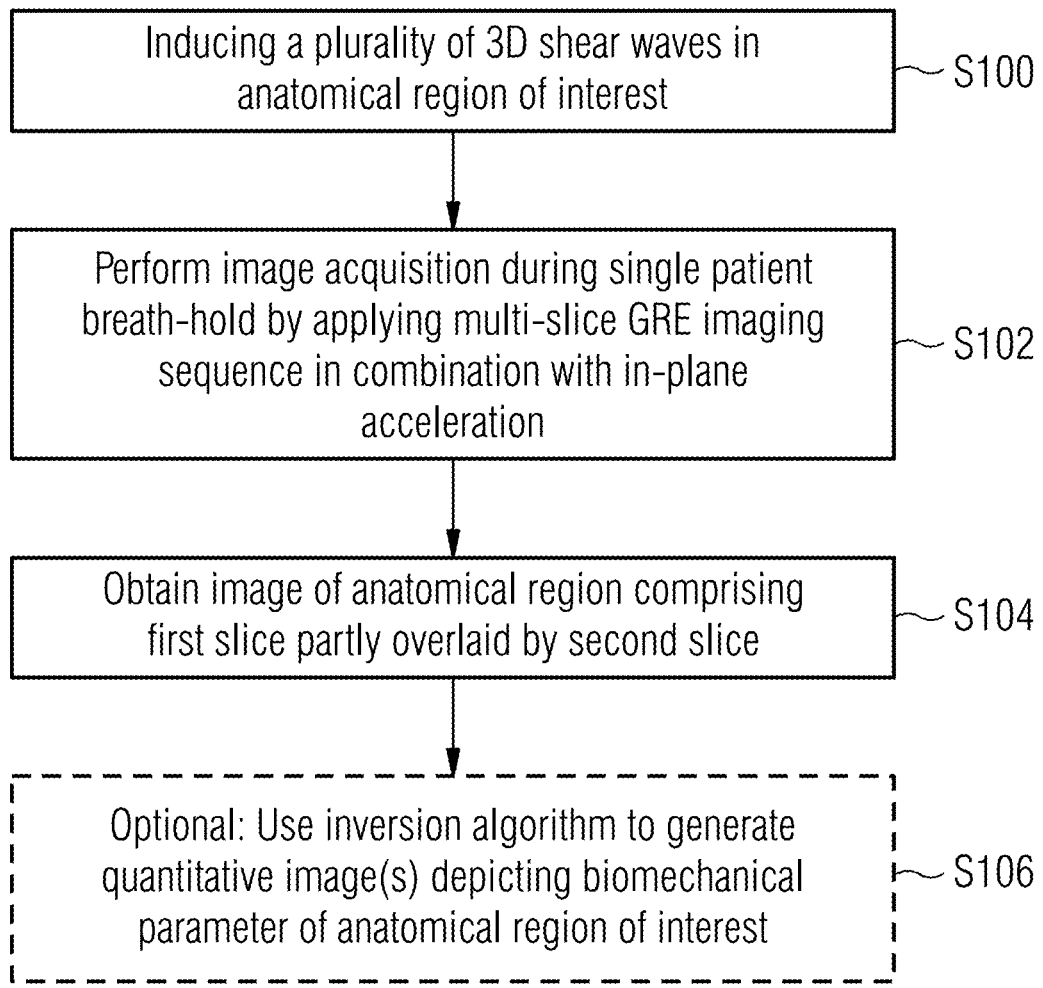
FIG. 7 shows a flow chart showing example steps to obtain images using the present techniques.

FIG. 7 shows a flow chart showing example steps to obtain images using the present techniques. Specifically, the flow chart shows steps to perform three-dimensional magnetic resonance elastography, MRE, using a magnetic resonance imaging, MRI, apparatus. The method begins by inducing a plurality of three-dimensional shear or compressional waves in an anatomical region of interest in a patient (step S100). The anatomical region of interest may be, for example, the liver, brain or breast.

The method then comprises performing image acquisition during a single patient breath-hold by applying a multi-slice gradient echo, GRE, imaging sequence, in combination with an in-plane acceleration technique, to the anatomical region of interest (step S102). This may comprise applying a radio frequency, RF, pulse to the anatomical region of interest, where the RF pulse simultaneously exciting two slice locations in the anatomical region of interest. An example of the RF pulse that may be applied is shown in FIG. 1.

The in-plane acceleration technique may be used to perform in-plane slice accelerations (or undersampling). The in-plane acceleration technique may be a parallel imaging technique. The parallel imaging technique may be the GRAPPA acquisition technique, mentioned above.

Preferably, the motion needs to be synchronised with the temporal component of the 3D shear or compressional waves which are induced in the patient. Thus, applying a multi-slice GRE imaging sequence may comprise synchronising the application of the multi-slice GRE imaging sequence to mechanical vibrations in the anatomical region of interest caused by the three-dimensional shear/compressional waves.

Applying a multi-slice GRE imaging sequence at step S102 may comprise applying a motion encoding gradient in three axes simultaneously (which in aspects, may correspond to each of a slice, phase and read direction). For example, a Hadamard motion encoding gradient may be applied to each of the slice, phase and read directions. The Hadamard motion encoding gradient advantageously increases motion sensitivity and increases the signal-to-noise.

Step 102 may comprise using simultaneous multi-slice, SMS, imaging to perform image acquisition. The SMS imaging may use dual-band RF pulses with different phase cycles in the phase-encoding direction, which excites two slices simultaneously. This results in an image in which one slice is shifted in phase relative to the other slice. Thus, at step 104, the method comprises obtaining an image of the anatomical region comprising a first image slice and a second image slice, wherein the first slice and the second slice are partly overlaid in the image.

The method may further comprise processing the obtained image using an inversion algorithm to generate one or more quantitative images depicting a biomechanical parameter of the anatomical region of interest (step S106). The one or more quantitative images may depict any one or more of the following biomechanical parameters: stiffness, elasticity, viscosity, attenuation, wave speed, phase angle, and frequency dispersion.

In order to generate the quantitative images, decoding may be applied to each signal received by each coil of the MRI apparatus during image acquisition, prior to signal combination. Decoding is needed to remove any phase error in the signals. In the case that Hadamard encoding is used, the decoding is Hadamard decoding. That is, the decoding involves applying to the signals, the inverse of the matrix used to perform the Hadamard encoding. The decoding cannot easily be performed after coil signal combination, because it is difficult to remove the phase error after the signals have already been combined.

Figure 8:
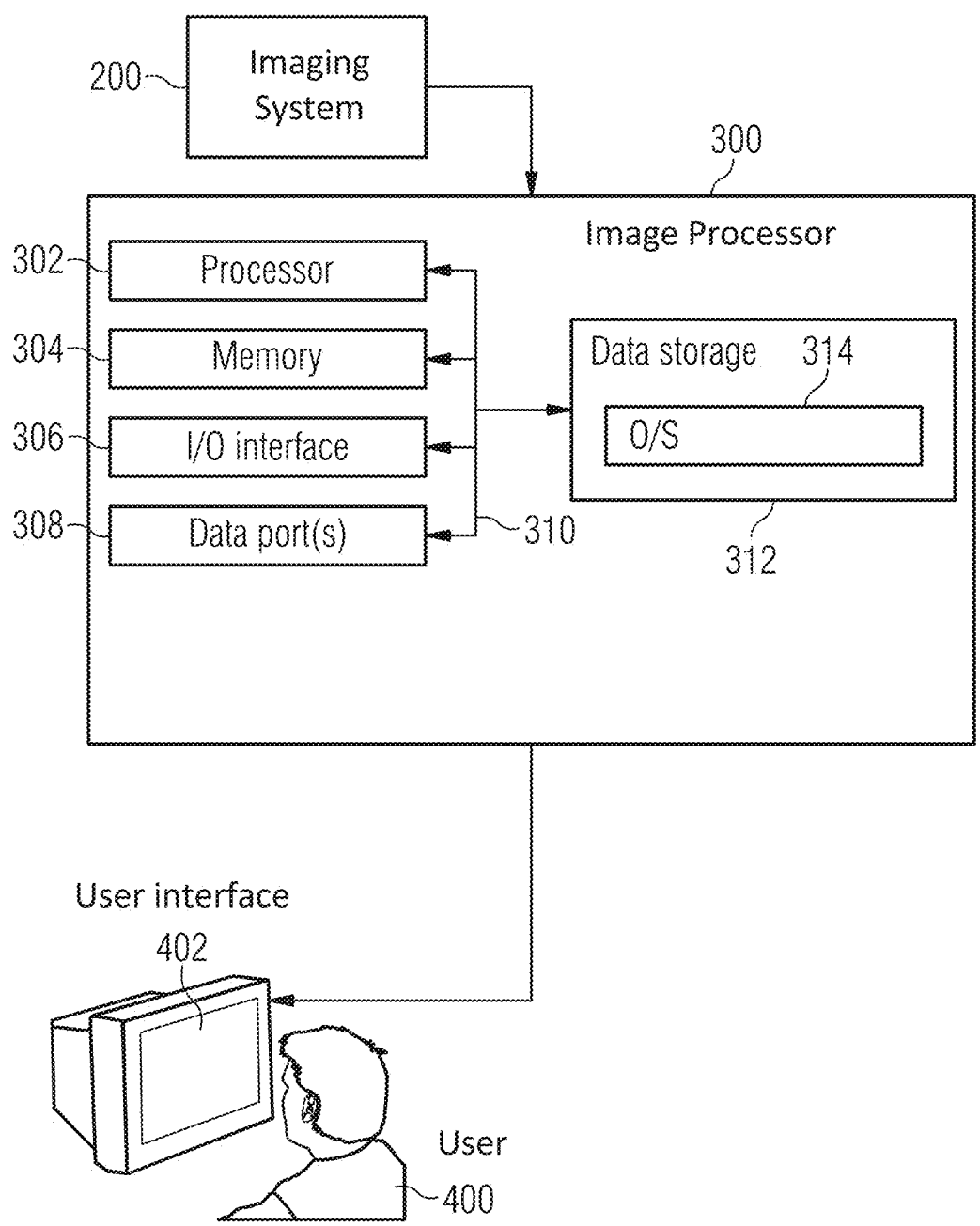
FIG. 8 is a block diagram of an example of a system which may be used to carry out the methods described herein.

The technique shown in FIG. 8 is advantageous because instead of running a 3D MRE scan as separate breath-holds, they are concatenated in one rapid scan. This increases patient comfort, increases success rate of 3D MRE, and allows a more robust and accurate MRE reconstruction because spatial misalignment between different encodings due lack of breath-hold reproducibility is avoided.

Furthermore, signal to noise loss that occurs due the SMS acquisition may be recovered via the (Hadamard) motion encoding scheme. This is particularly relevant when imaging certain parts of a patient. For example, for the typical volume acquired in a 3D MRE liver acquisition, the variation of coil profiles may not be sufficient.

FIG. 8 is a block diagram of a system which may be used to carry out the methods described herein. The image capture system comprises an image processor 300 which may be used to perform image processing. An imaging system 200, e.g. an X-ray machine, an MRI scanner or the like, captures images which are sent to the image processor 300. The outputs from the image processing may be output to a user 400 via any suitable user interface 402, e.g. a screen on a computer or other electronic device.

The image processor 300 may be formed from one or more local, remote or cloud servers. The image processor 300 may include one or more processors 302, one or more memory devices 304 (generically referred to herein as memory 304), one or more input/output ("I/O") interface(s) 306, one or more data ports 308, and data storage 312. The image processor 300 may further include one or more buses 310 that functionally couple various components of the image processor 300.

The data storage 312 may store one or more operating systems (O/S) 314; and one or more program modules, applications, engines, computer-executable code, scripts, or the like. Any of the components depicted as being stored in data storage 312 may include any combination of software, firmware, and/or hardware. The software and/or firmware may include computer-executable code, instructions, or the like that may be loaded into the memory 304 for execution by one or more of the processor(s) 302 to perform any of the operations described earlier in connection with correspondingly named engines.

The bus(es) 310 may include at least one of a system bus, a memory bus, an address bus, or a message bus, and may permit exchange of information (e.g., data (including computer-executable code), signalling, etc.) between various components of the image processor 300. The bus(es) 310 may include, without limitation, a memory bus or a memory controller, a peripheral bus, an accelerated graphics port, and so forth. The bus(es) 310 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnects (PCI) architecture, a PCI-Express architecture, a Personal Computer Memory Card International Association (PCMCIA) architecture, a Universal Serial Bus (USB) architecture, and so forth.

The memory 304 of the image processor 300 may include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. Persistent data storage, as that term is used herein, may include non-volatile memory. In certain example aspects, volatile memory may enable faster read/write access than non-volatile memory. However, in certain other example aspects, certain types of non-volatile memory (e.g., FRAM) may enable faster read/write access than certain types of volatile memory.

In various implementations, the memory 304 may include multiple different types of memory such as various types of static random access memory (SRAM), various types of dynamic random access memory (DRAM), various types of unalterable ROM, and/or writeable variants of ROM such as electrically erasable programmable read-only memory (EEPROM), flash memory, and so forth. The memory 304 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The data storage 312 may include removable storage and/or non-removable storage including, but not limited to, magnetic storage, optical disk storage, and/or tape storage. The data storage 312 may provide non-volatile storage of computer-executable instructions and other data. The memory 304 and the data storage 312, removable and/or non-removable, are examples of computer-readable storage media (CRSM).

The data storage 312 may store computer-executable code, instructions, or the like that may be loadable into the memory 304 and executable by the processor(s) 302 to cause the processor(s) 302 to perform or initiate various operations. The data storage 312 may additionally store data that may be copied to memory 304 for use by the processor(s) 302 during the execution of the computer-executable instructions. Moreover, output data generated as a result of execution of the computer-executable instructions by the processor(s) 302 may be stored initially in memory 304, and may ultimately be copied to data storage 312 for non-volatile storage.

The data storage 312 may further store various types of data utilized by components of the image processor 300. Any data stored in the data storage 312 may be loaded into the memory 304 for use by the processor(s) 302 in executing computer-executable code. In addition, any data depicted as being stored in the data storage 312 may potentially be stored in one or more of the datastores and may be accessed and loaded in the memory 304 for use by the processor(s) 302 in executing computer-executable code.

The processor(s) 302 may be configured to access the memory 304 and execute computer-executable instructions loaded therein. For example, the processor(s) 302 may be configured to execute computer-executable instructions of the various program modules, applications, engines, or the like of the system to cause or facilitate various operations to be performed in accordance with one or more aspects of the disclosure. The processor(s) 302 may include any suitable processing unit capable of accepting data as input, processing the input data in accordance with stored computer-executable instructions, and generating output data. The processor(s) 302 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 302 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 302 may be capable of supporting any of a variety of instruction sets.

Referring now to other illustrative components depicted as being stored in the data storage 312, the O/S 314 may be loaded from the data storage 312 into the memory 304 and may provide an interface between other application software executing on the image processor 300 and hardware resources of the image processor 300. More specifically, the O/S 314 may include a set of computer-executable instructions for managing hardware resources of the system and for providing common services to other application programs (e.g., managing memory allocation among various application programs). In certain example aspects, the O/S 314 may control execution of one or more of the program modules depicted as being stored in the data storage 312. The O/S 314 may include any operating system now known or which may be developed in the future including, but not limited to, any server operating system, any mainframe operating system, or any other proprietary or non-proprietary operating system.

Referring now to other illustrative components of the image processor 300, the input/output (I/O) interface(s) 306 may facilitate the receipt of input information by the image processor 300 from one or more I/O devices as well as the output of information from the image processor 300 to the one or more I/O devices. The I/O devices may include any of a variety of components such as a display or display screen having a touch surface or touchscreen; an audio output device for producing sound, such as a speaker; an audio capture device, such as a microphone; an image and/or video capture device, such as a camera; a haptic unit; and so forth. Any of these components may be integrated into the image processor 300 or may be separate. The I/O devices may further include, for example, any number of peripheral devices such as data storage devices, printing devices, and so forth.

The I/O interface(s) 306 may also include an interface for an external peripheral device connection such as universal serial bus (USB), FireWire, Thunderbolt, Ethernet port or other connection protocol that may connect to one or more networks. The I/O interface(s) 306 may also include a connection to one or more antennas to connect to one or more networks via a wireless local area network (WLAN) (such as Wi-Fi) radio, Bluetooth, and/or a wireless network radio, such as a radio capable of communication with a wireless communication network such as a Long Term Evolution (LTE) network, WiMAX network, 3G network, etc.

The image processor 300 may further include one or more data ports 310 via which the image processor 300 may communicate with any of the processing modules. The data ports(s) 310 may enable communication with the image capture device 200 and the database 500.

It should be appreciated that the engines and the program modules depicted in the Figures are merely illustrative and not exhaustive and that processing described as being supported by any particular engine or module may alternatively be distributed across multiple engines, modules, or the like, or performed by a different engine, module, or the like. In addition, various program module(s), script(s), plug-in(s), Application Programming Interface(s) (API(s)), or any other suitable computer-executable code hosted locally on the system and/or hosted on other computing device(s) accessible via one or more of the network(s), may be provided to support the provided functionality, and/or additional or alternate functionality. Further, functionality may be modularized differently such that processing described as being supported collectively by the collection of engines or the collection of program modules may be performed by a fewer or greater number of engines or program modules, or functionality described as being supported by any particular engine or module may be supported, at least in part, by another engine or program module. In addition, engines or program modules that support the functionality described herein may form part of one or more applications executable across any number of devices of the system in accordance with any suitable computing model such as, for example, a client-server model, a peer-to-peer model, and so forth. In addition, any of the functionality described as being supported by any of the engines or program modules may be implemented, at least partially, in hardware and/or firmware across any number of devices.

It should further be appreciated that the system may include alternate and/or additional hardware, software, or firmware components beyond those described or depicted without departing from the scope of the disclosure. More particularly, it should be appreciated that software, firmware, or hardware components depicted as forming part of the system are merely illustrative and that some components may not be present or additional components may be provided in various aspects. While various illustrative engines have been depicted and described as software engines or program modules, it should be appreciated that functionality described as being supported by the engines or modules may be enabled by any combination of hardware, software, and/or firmware. It should further be appreciated that each of the above-mentioned engines or modules may, in various aspects, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular engine or module may, in various aspects, be provided at least in part by one or more other engines or modules. Further, one or more depicted engines or modules may not be present in certain aspects, while in other aspects, additional engines or modules not depicted may be present and may support at least a portion of the described functionality and/or additional functionality. Moreover, while certain engines modules may be depicted or described as sub-engines or sub-modules of another engine or module, in certain aspects, such engines or modules may be provided as independent engines or modules or as sub-engines or sub-modules of other engines or modules.

The operations described and depicted in the illustrative methods of FIG. 7 may be carried out or performed in any suitable order as desired in various example aspects of the disclosure. Additionally, in certain example aspects, at least a portion of the operations may be carried out in parallel. Furthermore, in certain example aspects, less, more, or different operations than those depicted in FIG. 7 may be performed.

Although specific aspects of the disclosure have been described, one of ordinary skill in the art will recognize that numerous other modifications and alternative aspects are within the scope of the disclosure. For example, any of the functionality and/or processing capabilities described with respect to a particular system, system component, device, or device component may be performed by any other system, device, or component. Further, while various illustrative implementations and architectures have been described in accordance with aspects of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example aspects. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some aspects. Further, additional components and/or operations beyond those depicted in blocks of the block and/or flow diagrams may be present in certain aspects.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Program modules, applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example aspects, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program modules, or other data transmitted within a data signal, such as a carrier wave, or other transmission. However, as used herein, CRSM does not include CRCM.

Although aspects have been described in language specific to structural features and/or methodological acts, it is to be understood that the disclosure is not necessarily limited to the specific features or acts described. Rather, the specific features and acts are disclosed as illustrative forms of implementing the aspects. Conditional language, such as, among others, "can," "could," "might," or "may," unless specifically stated otherwise, or otherwise understood within the context as used, is generally intended to convey that certain aspects could include, while other aspects do not include, certain features, elements, and/or steps. Thus, such conditional language is not generally intended to imply that features, elements, and/or steps are in any way required for one or more aspects or that one or more aspects necessarily include logic for deciding, with or without user input or prompting, whether these features, elements, and/or steps are included or are to be performed in any particular aspect.

The invention claimed is:

1. A method for performing three-dimensional magnetic resonance elastography, MRE, using a magnetic resonance imaging, MRI, apparatus, the method comprising:
    inducing a plurality of three-dimensional shear or compressional waves in an anatomical region of interest in a patient;
    performing image acquisition during a single patient breath-hold by applying a multi-slice gradient echo, GRE, imaging sequence, in combination with an in-plane acceleration technique, to the anatomical region of interest, wherein the applying the multi-slice GRE imaging sequence comprises synchronizing the application of the multi-slice GRE imaging sequence to mechanical vibrations in the anatomical region of interest caused by the three-dimensional shear or compressional waves, and wherein the synchronizing the application of the multi-slice GRE imaging sequence to mechanical vibrations comprises applying a constant delay after each imaging shot within the multi-slice GRE imaging sequence; and
    obtaining an image of the anatomical region comprising a first image slice and a second image slice, wherein the first image slice and the second image slice are partly overlaid in the image.

2. The method as claimed in claim 1, wherein applying a multi-slice GRE imaging sequence comprises:
    applying a radio frequency, RF, pulse to the anatomical region of interest, the RF pulse simultaneously exciting two slice locations in the anatomical region of interest.

3. The method as claimed in claim 1, wherein the in-plane acceleration technique is a parallel imaging technique.

4. The method as claimed in claim 3, wherein the parallel imaging technique is a GeneRalized Autocalibrating Partial Parallel Acquisition, GRAPPA, technique.

5. The method as claimed in claim 1, wherein applying a multi-slice GRE imaging sequence further comprises performing an interleaved acquisition of multiple slices and wave offsets.

6. The method as claimed in claim 1, wherein performing image acquisition comprises using simultaneous multi-slice, SMS, imaging.

7. The method as claimed in claim 1, wherein the anatomical region of interest is a liver, brain, or breast.

8. The method as claimed in claim 1, wherein the applying a multi-slice GRE imaging sequence comprises:
    applying a motion encoding gradient on three axes simultaneously.

9. A method for performing three-dimensional magnetic resonance elastography, MRE, using a magnetic resonance imaging, MRI apparatus, the method comprising:
    inducing a plurality of three-dimensional shear or compressional waves in an anatomical region of interest in a patient;
    performing image acquisition during a single patient breath-hold by applying a multi-slice gradient echo, GRE, imaging sequence, in combination with an in-plane acceleration technique, to the anatomical region of interests, wherein the applying a multi-slice GRE imaging sequence comprises:
    applying a motion encoding gradient on three axes simultaneously; and obtaining of the anatomical region comprising a first image slice and a second image slice, wherein the first image slice and the second image slice are partly overlaid in the image.

10. The method as claimed in claim 9, wherein the three axes correspond to slice, phase and read directions.

11. The method as claimed in claim 9, wherein applying the motion encoding gradient comprises applying a Hadamard motion encoding gradient.

12. The method as claimed in claim 11, further comprising:
processing the obtained image using an inversion algorithm to generate one or more quantitative images depicting a biomechanical parameter of the anatomical region of interest.

13. The method as claimed in claim 12, wherein the one or more quantitative images depict any one or more of the following biomechanical parameters: stiffness, elasticity, viscosity, attenuation, wave speed, phase angle, and frequency dispersion.

14. The method as claimed in claim 12, wherein decoding is applied to each signal received by each coil of the MRI apparatus during image acquisition, prior to signal combination.

15. The method as claimed in claim 14, wherein the decoding applied to each signal is Hadamard decoding.

16. A non-transitory computer-readable medium having processor control code stored thereon that, when executed by a processor controller cause a magnetic resonance imaging, MRI, apparatus to perform three-dimensional magnetic resonance elastography, MRE, by:
inducing a plurality of three-dimensional shear or compressional waves in an anatomical region of interest in a patient;
performing image acquisition during a single patient breath-hold by applying a multi-slice gradient echo, GRE, imaging sequence, in combination with an in-plane acceleration technique, to the anatomical region of interest, wherein the applying a multi-slice GRE imaging sequence comprises applying a motion encoding gradient on three axes simultaneously; and
obtaining an image of the anatomical region comprising a first image slice and a second image slice, wherein the first image slice and the second image slice are partly overlaid in the image.

17. An image capture system for performing three-dimensional magnetic resonance elastography, MRE, the system comprising:
a transducer which is configured to induce a plurality of three-dimensional shear or compressional waves in an anatomical region of interest in a patient;
an image capture device which is configured to capture images during a single patient breath-hold by:
applying a multi-slice gradient echo, GRE, imaging sequence, in combination with an in-plane acceleration technique, to the anatomical region of interest, wherein the applying the multi-slice GRE imaging sequence comprises synchronizing the application of the multi slice GRE imaging sequence to mechanical vibrations in the anatomical region of interest caused by the three-dimensional shear or compressional waves, and wherein the synchronizing the application of the multi-slice GRE imaging sequence to mechanical vibrations comprises applying a constant delay after each imaging shot within the multi-slice GRE imaging sequence; and
obtaining an image of the anatomical region comprising a first image slice and a second image slice, wherein the first image slice and the second image slice are partly overlaid in the image; and
a user interface which is configured to display the images captured by the image capture device.

* * * * *